(12) United States Patent
Chen et al.

(10) Patent No.: US 9,583,348 B2
(45) Date of Patent: *Feb. 28, 2017

(54) SILANE AND BORANE TREATMENTS FOR TITANIUM CARBIDE FILMS

(71) Applicant: ASM IP Holding B.V., Almere (NL)

(72) Inventors: Jerry Chen, Chandler, AZ (US); Vladimir Machkaoutsan, Leuven (BE); Brennan Milligan, Gold Canyon, AZ (US); Jan Maes, Wilrijk (BE); Suvi Haukka, Helsinki (FI); Eric Shero, Phoenix, AZ (US); Tom Blomberg, Vantaa (FI); Dong Li, Phoenix, AZ (US)

(73) Assignee: ASM IP HOLDING B.V., Almere (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/987,413

(22) Filed: Jan. 4, 2016

(65) Prior Publication Data

US 2016/0196977 A1 Jul. 7, 2016

Related U.S. Application Data

(63) Continuation of application No. 14/461,995, filed on Aug. 18, 2014, now Pat. No. 9,236,247, which is a
(Continued)

(51) Int. Cl.
*H01L 21/336* (2006.01)
*H01L 21/8234* (2006.01)
(Continued)

(52) U.S. Cl.
CPC ..... *H01L 21/28088* (2013.01); *H01L 21/0228* (2013.01); *H01L 21/02186* (2013.01);
(Continued)

(58) Field of Classification Search
CPC ........... H01L 21/0228; H01L 21/02444; H01L 21/02186; H01L 21/02642; H01L 21/02321; H01L 21/3141; H01L 21/2807; H01L 21/28556; H01L 27/1104; H01L 29/435; H01L 29/7869; H01L 29/66045
(Continued)

(56) References Cited

U.S. PATENT DOCUMENTS 3,708,728 A 1/1973 Sterling et al.
3,925,337 A 12/1975 Heiberger
(Continued)

FOREIGN PATENT DOCUMENTS

EP 0387403 9/1990
EP 0394054 10/1990
(Continued)

OTHER PUBLICATIONS

1988RD-0296076 (Nov. 20, 1998), Field effect transistor structure with improved transconductant—contg. spacer-less conducting gate oxide, and tungsten deposited on source and drain, EAST Version 2.0.1.4 Patent-Assignee: Anonymous[Anon], Sep. 19, 2005.
(Continued)

*Primary Examiner* — David Nhu
(74) *Attorney, Agent, or Firm* — Knobbe, Martens, Olson & Bear LLP

(57) ABSTRACT

Methods of treating metal-containing thin films, such as films comprising titanium carbide, with a silane/borane agent are provided. In some embodiments a film comprising titanium carbide is deposited on a substrate by an atomic layer deposition (ALD) process. The process may include a plurality of deposition cycles involving alternating and sequential pulses of a first source chemical that comprises titanium and at least one halide ligand, a second source chemical comprising metal and carbon, wherein the metal
(Continued)

and the carbon from the second source chemical are incorporated into the thin film, and a third source chemical, wherein the third source chemical is a silane or borane that at least partially reduces oxidized portions of the titanium carbide layer formed by the first and second source chemicals. In some embodiments treatment forms a capping layer on the metal carbide film.

20 Claims, 2 Drawing Sheets

Related U.S. Application Data continuation of application No. 13/829,856, filed on Mar. 14, 2013, now Pat. No. 8,841,182.

(51) Int. Cl.
H01L 21/28 (2006.01)
H01L 21/02 (2006.01)
H01L 21/285 (2006.01)

(52) U.S. Cl.
CPC .. *H01L 21/02321* (2013.01); *H01L 21/02337* (2013.01); *H01L 21/2807* (2013.01); *H01L 21/28044* (2013.01); *H01L 21/28556* (2013.01); *H01L 21/28568* (2013.01)

(58) Field of Classification Search
USPC ............... 438/104, 197, 82, 786, 680, 681; 257/E21.005, E21.006, E21.077, E21.17, 257/E21.126, E21.127, E21.274, E21.324, 257/E21.319, E21.421
See application file for complete search history.

(56) References Cited

U.S. PATENT DOCUMENTS

| | | |
|---|---|---|
| 4,058,430 A | 11/1977 | Suntola et al. |
| 4,282,267 A | 8/1981 | Küyel |
| 4,389,973 A | 6/1983 | Suntola et al. |
| 4,565,747 A | 1/1986 | Nakae et al. |
| 4,747,367 A | 5/1988 | Posa |
| 4,761,269 A | 8/1988 | Conger et al. |
| 4,767,494 A | 8/1988 | Kobayashi |
| 4,851,095 A | 7/1989 | Scobey et al. |
| 4,935,661 A | 6/1990 | Heinecke et al. |
| 5,071,670 A | 12/1991 | Kelly |
| 5,166,092 A | 11/1992 | Mochizuki et al. |
| 5,221,556 A | 6/1993 | Hawkins et al. |
| 5,270,247 A | 12/1993 | Sakuma et al. |
| 5,281,274 A | 1/1994 | Yoder |
| 5,306,666 A | 4/1994 | Izumi |
| 5,316,793 A | 5/1994 | Wallace et al. |
| 5,342,652 A | 8/1994 | Foster et al. |
| 5,595,784 A | 1/1997 | Kaim et al. |
| 5,603,771 A | 2/1997 | Seiberras et al. |
| 5,618,395 A | 4/1997 | Gartner |
| 5,691,235 A | 11/1997 | Meikle et al. |
| 5,693,139 A | 12/1997 | Nishizawa et al. |
| 5,711,811 A | 1/1998 | Suntola et al. |
| 5,723,384 A | 3/1998 | Park et al. |
| 5,744,254 A | 4/1998 | Kampe et al. |
| 5,769,950 A | 6/1998 | Takasu et al. |
| 5,789,024 A | 8/1998 | Levy et al. |
| 5,855,680 A | 1/1999 | Soininen |
| 5,916,365 A | 6/1999 | Sherman |
| 5,946,598 A | 8/1999 | Yeh |
| 5,947,710 A | 9/1999 | Cooper et al. |
| 5,964,943 A | 10/1999 | Stein et al. |
| 5,965,004 A | 10/1999 | Cowley et al. |
| 5,972,430 A | 10/1999 | DiMeo et al. |
| 5,973,400 A | 10/1999 | Murakami et al. |
| 6,006,763 A | 12/1999 | Mori et al. |
| 6,015,590 A | 1/2000 | Suntola et al. |
| 6,087,257 A | 7/2000 | Park et al. |
| 6,099,904 A | 8/2000 | Mak et al. |
| 6,104,074 A | 8/2000 | Chen |
| 6,113,977 A | 9/2000 | Soininen et al. |
| 6,124,158 A | 9/2000 | Dautartas et al. |
| 6,139,624 A | 10/2000 | Rupp |
| 6,139,700 A | 10/2000 | Kang et al. |
| 6,144,060 A | 11/2000 | Park et al. |
| 6,156,382 A | 12/2000 | Rajagopalan et al. |
| 6,162,501 A | 12/2000 | Kim |
| 6,174,809 B1 | 1/2001 | Kang et al. |
| 6,188,134 B1 | 2/2001 | Stumborg et al. |
| 6,194,310 B1 | 2/2001 | Hsu et al. |
| 6,200,389 B1 | 3/2001 | Miller et al. |
| 6,203,613 B1 | 3/2001 | Gates et al. |
| 6,206,967 B1 | 3/2001 | Mak et al. |
| 6,234,646 B1 | 5/2001 | Ito |
| 6,270,572 B1 | 8/2001 | Kim et al. |
| 6,284,646 B1 | 9/2001 | Leem |
| 6,287,965 B1 | 9/2001 | Kang et al. |
| 6,342,277 B1 | 1/2002 | Sherman |
| 6,355,561 B1 | 3/2002 | Sandhu et al. |
| 6,380,627 B1 | 4/2002 | Weihs et al. |
| 6,391,785 B1 | 5/2002 | Satta et al. |
| 6,416,577 B1 | 7/2002 | Suntola et al. |
| 6,464,779 B1 | 10/2002 | Powell et al. |
| 6,475,276 B1 | 11/2002 | Elers et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,511,539 B1 | 1/2003 | Raaijmakers |
| 6,534,395 B2 | 3/2003 | Werkhoven et al. |
| 6,576,053 B1 | 6/2003 | Kim et al. |
| 6,599,572 B2 | 7/2003 | Saanila et al. |
| 6,616,982 B2 | 9/2003 | Merrill et al. |
| 6,632,595 B2 | 10/2003 | Kikuchi et al. |
| 6,652,924 B2 | 11/2003 | Sherman |
| 6,706,115 B2 | 3/2004 | Leskela et al. |
| 6,727,169 B1 | 4/2004 | Raaijmakers et al. |
| 6,780,704 B1 | 8/2004 | Raaijmakers et al. |
| 6,794,287 B2 | 9/2004 | Saanila et al. |
| 6,797,340 B2 | 9/2004 | Fang et al. |
| 6,800,383 B1 | 10/2004 | Lakhotkin |
| 6,800,552 B2 | 10/2004 | Elers et al. |
| 6,809,026 B2 | 10/2004 | Yoon et al. |
| 6,821,889 B2 | 11/2004 | Elers et al. |
| 6,827,978 B2 | 12/2004 | Yoon et al. |
| 6,833,161 B2 | 12/2004 | Wang et al. |
| 6,863,727 B1 | 3/2005 | Elers et al. |
| 6,902,763 B1 | 6/2005 | Elers et al. |
| 6,986,914 B2 | 1/2006 | Elers et al. |
| 7,015,153 B1 | 3/2006 | Triyoso et al. |
| 7,045,406 B2 | 5/2006 | Huotari et al. |
| 7,138,336 B2 | 11/2006 | Lee et al. |
| 7,211,144 B2 | 5/2007 | Lu et al. |
| 7,211,508 B2 | 5/2007 | Chung et al. |
| 7,268,078 B2 | 9/2007 | Iyer |
| 7,405,158 B2 | 7/2008 | Lai et al. |
| 7,416,981 B2 | 8/2008 | Lee et al. |
| 7,595,263 B2 * | 9/2009 | Chung .................. C23C 16/02 438/633 |
| 8,841,182 B1 * | 9/2014 | Chen ................. H01L 21/02186 257/E21.005 |
| 8,846,550 B1 * | 9/2014 | Shero ................ H01L 21/28088 257/E21.006 |
| 9,111,749 B2 * | 8/2015 | Shero ................ H01L 21/02211 |
| 9,236,247 B2 * | 1/2016 | Chen .................... H01L 21/0228 |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |

(56) References Cited

U.S. PATENT DOCUMENTS

| | | |
|---|---|---|
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0271813 A1 | 12/2005 | Kher et al. |
| 2006/0019494 A1 | 1/2006 | Cao et al. |
| 2006/0079090 A1 | 4/2006 | Elers et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0148350 A1 | 6/2007 | Rahtu Antti et al. |
| 2007/0218670 A1 | 9/2007 | Ishizaka |
| 2008/0102204 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0315093 A1 | 12/2009 | Li et al. |

FOREIGN PATENT DOCUMENTS

| | | |
|---|---|---|
| EP | 0442490 | 8/1991 |
| EP | 0526779 | 2/1993 |
| EP | 0528779 | 2/1993 |
| EP | 0573033 | 12/1993 |
| EP | 0774533 | 5/1997 |
| EP | 0899779 | 3/1999 |
| EP | 1 158 070 | 11/2001 |
| EP | 1167567 | 1/2002 |
| JP | 58-033841 | 2/1983 |
| JP | 06-037041 | 2/1994 |
| JP | 06-069157 | 3/1994 |
| JP | 07-230957 | 8/1995 |
| JP | 08-264530 | 10/1996 |
| JP | 09-087857 | 3/1997 |
| KR | 2003-0016346 | 2/2003 |
| KR | 2003-0057938 | 7/2003 |
| KR | 2003-0093575 | 12/2003 |
| KR | 2004-0060402 | 7/2004 |
| KR | 2004-0079173 | 9/2004 |
| KR | 2004-0079175 | 9/2004 |
| KR | 2004-0100767 | 12/2004 |
| KR | 2005-0000168 | 1/2005 |
| WO | WO 96/17107 | 6/1996 |
| WO | WO 96/18756 | 6/1996 |
| WO | WO 98/51838 | 11/1998 |
| WO | WO 99/37655 | 7/1999 |
| WO | WO 00/01006 | 1/2000 |
| WO | WO 00/04704 | 1/2000 |
| WO | WO 00/40772 | 7/2000 |
| WO | WO 00/47404 | 8/2000 |
| WO | WO 00/47796 | 8/2000 |
| WO | WO 00/54320 | 9/2000 |
| WO | WO 00/55895 | 9/2000 |
| WO | WO 00/63957 | 10/2000 |
| WO | WO 01/27347 | 4/2001 |
| WO | WO 01/29280 | 4/2001 |
| WO | WO 01/29891 | 4/2001 |
| WO | WO 01/29893 | 4/2001 |
| WO | WO 01/53565 | 7/2001 |
| WO | WO 01/66832 | 9/2001 |
| WO | WO 01/78213 | 10/2001 |
| WO | WO 01/88972 | 11/2001 |
| WO | WO 2004/077515 | 9/2004 |
| WO | WO 2006/080782 | 8/2006 |
| WO | WO 2007/041089 | 4/2007 |
| WO | WO 2008/137399 | 11/2008 |

OTHER PUBLICATIONS

Aarik et al., "Influence of substrate temperature on atomic layer growth and properties of HfO2 thin films", Thin Solid Films, vol. 340, 1999, pp. 110-116.

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Andricacos et al., Damascene copper electroplating for chip, IBM Jour. Research and Dev., 1998, vol. 42, Issue 5, pp. 567-574.

Bain et al., Deposition of tungsten by plasma enhanced chemical vapour deposition, J. Phys. IV France, 1999, vol. 9, pp. 827-833.

Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

Elers et al., NbC15 as a precursor in atomic layer epitaxy, Applied Surface Science, Jul. 9, 1994, vol. 82/83, pp. 468-474.

Favis et al., Atomic layer epitaxy of silicon, silicon/germanium and silicon carbide via extraction/exchange processes, Avail. NTIS. Report, 1991, pp. 33.

Fuyuki et al., Atomic layer epitaxy controlled by surface super-structures in silicon carbide, Thin Solid Films, 1993, vol. 225, Issue 1-2, pp. 225-229.

Fuyuki et al., Atomic layer epitaxy of cubic silicon carbide by gas source MBE using surface superstructure, J. Cryst. Growth, 1989, vol. 95, Issue 1-4, pp. 461-463.

Girolami et al., Tailored Organometallics as Low-Temperature CVD Precursors to Thin Films, Materials Research Society Symposium Proceedings, 1988, vol. 121, pp. 429-438.

Gordon et al., "A Kinetic Model for Step Coverage by Atomic Layer Deposition in Narrow Holes or Trenches", Chemical Vapor Deposition, 2003, vol. 9, No. 2, pp. 73-78.

Hara et al., Atomic layer control of .beta.-silicon carbide (001) surface, Springer Proc. Phys., 1992, pp. 90-95.

Hiltunen et al., Nitrides of titanium, niobium, tantalum and molybdenum grown as thin films by the atomic layer epitaxy method, Thin Solid Films, 1988, vol. 166, pp. 149-154.

Hultman et al., "Review of the Thermal and Mechanical Stability of TiN-based Thin Films" Zeitscrift Fur Metallkunde 90 (10): 803-813 (1999).

Ihanus et al., "ALE growth of $ZnS_{1-x}Se_x$ thin films by substituting surface sulfur with elemental selenium," Appl. Surface Sci., 112:154-158 (1997).

International Search Report and Written Opinion dated Apr. 7, 2008, Application No. PCT/US2007/082131.

Jehn at al., Gmelin Handbook of Inorganic and Organometallic Chemistry, 8th Edition, 1993, vol. A 5b, Issue 54, pp. 131-154.

Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.

Juppo et al., Deposition of copper films by an alternate supply of CuCl and Zn, J. Vac. Sci. Technol A, Jul./Aug. 1997, vol. 15, Issue 4, pp. 2330-2333.

Kattelus et al., "Electrical Properties of Tantalum Based Composite Oxide Films," Mat. Res. Soc. Symp. Proc. vol. 284, pp. 511-516 (1993).

Kattelus et al., "Layered tantalum-aluminum oxide films deposited by atomic layer epitaxy," Thin Solid Films, Vo. 225, pp. 296-298 (1993).

Kim et al., Atomic-layer-depositied WNxCy thin films as diffusion barrier for copper metallization, Applied Physics Letters, Jun. 23, 2003, vol. 82, Issue 25, pp. 4486-4488.

(56) References Cited

OTHER PUBLICATIONS

Kim et al., "Novel capacitor technology for high density stand-alone and embedded DRAMs," ieee International Electron Devices Meeting, IEDM (2000).

Kirk-Othmer, Encyclopedia of Chemical Technology, John Wiley & Sons, Inc., 1992, vol. 4, pp. 841-878.

Klaus et al., Atomic Layer Deposition of Tungsten Nitride Films Using Sequential Surface Reactions, Journal of the Electrochemical Society, 2000, vol. 147, Issue 3, pp. 1175-1181.

Klaus et al., Atomic layer deposition of tungsten using sequential surface chemistry with a sacrificial stripping reaction, Thin Solid Films, 2000, vol. 360, pp. 145-153.

Klaus et al., Atomic layer deposition of tungsten and tungsten nitride using sequential surface reactions, AVS $46^{th}$ International Symposium, 1999, Seattle, WA, US.

Klaus et al., Atomically controlled growth of tungsten and tungsten nitride using sequential surface reactions, Applied Surface Science, 2000, vol. 162-163, pp. 479-491.

Kukli et al., Properties of $(Nb_{1-x}Ta_x)_2O_5$ Solid Solutions and $(Nb_{1-x}Ta_x)_2O_5$-$ZrO_2$ Nanolaminates Growth by Atomic Layer Epitaxy, NanoStructured Materials, 1997, vol. 8, pp. 785-793.

Lai et al., Precursors for Organometallic Chemical Vapor Deposition of Tungsten Carbide Films, Chem. Mater., 1995, vol. 7, pp. 2284-2292.

Lakomaa et al., "Surface reactions in $Al_2O_3$ growth from trimethylaluminum and water by atomic layer epitaxy," Applied Surface Science, vol. 107, pp. 107-115 (1996).

Leskelä et al., ALD precursor chemistry: Evolution and future challenges, Jour. Phys. IV France 9, 1999, pp. 837-852.

Ludviksson et al., Low-Temperature Thermal CVD of Ti—Al Metal Films Using a Strong Reducing Agent, Chem. Vap. Deposition, 1998, vol. 4, Issue 4, pp. 129-132.

Martensson, Use of atomic layer epitaxy for fabrication of Si/TiN/Cu structures, J. Vac. Sci. Technol. B, Sep./Oct. 1999, vol. 17, Issue 5, pp. 2122-2128.

Martensson et al., Atomic Layer Epitaxy of Copper and Tantalum, Chemical Vapor Deposition, 1997, vol. 3, Issue 1, pp. 45-50.

Martensson et al., $CU(THD)_2$ As Copper Source in Atomic Layer Epitaxy, Electrochemical Society Proceedings, vol. 97-25, (1997) pp. 1529-1536.

Matsunami et al., Hetero-Interface control and atomic layer epitaxy of SiC, Applied Surface Science, 1997, vol. 112, pp. 171-175.

Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.

Min et al., Atomic Layer Deposition of TiN Thin Films by Sequential Introduction of Ti Precursor and $HN_3$, Mat. Res. Soc. Symp. Proc., 1998, vol. 514, pp. 337-342.

Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.

Polyakov et al., Growth of GaBN Ternary Soloutions by Organometallic Vapor Phase Epitaxy, Journal of Electronic Materials, 1997, vol. 26, Issue 3, pp. 237-242.

Ritala et al., Atomic layer epitaxy growth of TiN thin films, J. Electrochem. Soc., 1995, vol. 142, Issue 8, pp. 2731-2737.

Ritala et al., Atomic Layer Epitaxy Growth of TiN Thin Films from $TiI_4$ and $NH_3$, J. Electrochem. Soc., Aug. 1998, vol. 145, Issue 8, pp. 2914-2920.

Ritala et al., "Controlled Growth of TaN, $Ta_3N_5$, and $TaO_xN_y$ Thin Films by Atomic Layer Deposition", Chem. Mater., 1999, vol. 11, pp. 1712-1718.

Ritala et al., Effects of intermediate zinc pulses on properties of TiN and NbN films deposited by atomic layer epitaxy, Appl. Surf. Sci., 1997, vol. 120, pp. 199-212.

Ritala et al., Perfectly conformal TiN and $Al_2O_3$ films deposited by atomic layer deposition, Chem. Vapor Deposition, 1999, vol. 5, pp. 7-9.

Ritala et al., Surface roughness reduction in atomic layer epitaxy grown of titanium dioxide thin films, Thin Solid Films, vol. 249, pp, 155-162 (1994).

Sadayuki et al., Sub-atomic layer growth of SiC at low temperatures, Japanese Journal of Applied Physics, 1995, vol. 34, Issue 11, pp. 6166-6170.

Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.

Sherman et al., Plasma enhanced atomic layer deposition of Ta for diffusion barrier applications, AVS $46^{th}$ International Symposium, Oct. 26, 1999, Seattle, WA, US.

Tulhoff et al., Ullmann's Encyclopedia of Industrial Chemistry, $5^{th}$, Completely Revised Edition, 1986, vol. A5, pp. 61-77.

Suntola, "Atomic Layer Epitaxy," Handbook of Crystal Growth 3, Ch. 14, pp. 601-663 (1994).

Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).

Wong et al., Barriers for copper interconnections, Solid State Technology, 1999, pp. 1-7.

Yang et al., Atomic Layer Deposition of Tungsten Film from $WF_6$/$B_2H_6$: Nucleation Layer for Advanced Semiconductor Devices, Advanced Metallization Conference 2001 (AMC 2001), Conference Proceedings ULSI XVII@2002 Materials Research Society, 2001, pp. 655-660.

Zhang et al., "High permittivity thin film nanolaminates," Journal of Applied Physics, vol. 87, No. 4, pp. 1921-1924 (2000).

U.S. Appl. No. 11/591,845 filed Nov. 1, 2006 including prosecution history, including but not limited to, Office Action dated Sep. 4, 2008, Office Action dated May 28, 2009, and Notice of Allowance dated Sep. 4, 2009.

U.S. Appl. No. 10/049,125 filed Aug. 20, 2002 including prosecution history, including but not limited to, Office Action dated Apr. 8, 2004, Office Action dated Jun. 18, 2003, and Office Action dated Oct. 27, 2003.

U.S. Appl. No. 10/969,297 filed Oct. 19, 2004 including prosecution history, including but not limited to, Office Action dated Oct. 11, 2006, Office Action dated Apr. 12, 2007, and Notice of Allowance dated Sep. 18, 2007.

U.S. Appl. No. 11/288,872 filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.

U.S. Appl. No. 10/242,368 filed Sep. 12, 2002 including prosecution history, including but not limited to, Office Action dated Oct. 20, 2004, Office Action dated Apr. 27, 2004, and Notice of Allowance dated Jul. 19, 2005.

U.S. Appl. No. 11/286,203 filed Nov. 22, 2005 including prosecution history, including but not limited to Office Action dated Sep. 28, 2007.

\* cited by examiner

SILANE AND BORANE TREATMENTS FOR TITANIUM CARBIDE FILMS

REFERENCE TO RELATED APPLICATIONS

The present application is a continuation of U.S. application Ser. No. 14/461,995 filed Aug. 18, 2014, now U.S. Pat. No. 9,236,247, which is a continuation of U.S. application Ser. No. 13/829,856 filed Mar. 14, 2013 and issued as U.S. Pat. No. 8,841,182, each of which is hereby incorporated by reference in its entirety.

BACKGROUND OF THE INVENTION

Field of the Invention

The present invention relates generally to processes for producing metal carbide thin films on a substrate by atomic layer deposition. In some embodiments, titanium carbide films produced by the atomic layer deposition (ALD) processes disclosed herein can be used in metal gate and metal electrode applications in metal oxide semiconductor field effect transistors (MOSFETs), such as n-channel MOSFETs (NMOS).

Description of the Related Art

Atomic layer deposition (ALD) is a generally self-limiting process, whereby alternated pulses of reaction precursors saturate a substrate surface and leave no more than about one monolayer of material per pulse. The deposition conditions and precursors are selected to provide self-saturating reactions, such that an adsorbed layer in one pulse leaves a surface termination that is non-reactive with the gas phase reactants of the same pulse. A subsequent pulse of different reactants reacts with the previous termination to enable continued deposition. Thus, each cycle of alternated pulses leaves no more than about one molecular layer of the desired material. The principles of ALD type processes have been presented by T. Suntola, e.g. in the Handbook of Crystal Growth 3, Thin Films and Epitaxy, Part B: Growth Mechanisms and Dynamics, Chapter 14, Atomic Layer Epitaxy, pp. 601-663, Elsevier Science B. V. 1994, the disclosure of which is incorporated herein by reference.

In a typical ALD process for depositing thin films, one deposition cycle comprises exposing the substrate to a first precursor, removing unreacted first reactant and reaction byproducts from the reaction chamber, exposing the substrate to a second precursor, followed by a second removal step. Typically, halide precursors, such as $TiCl_4$ and $HfCl_4$, are used as precursors in ALD deposition because those precursors are inexpensive and relatively stable, but at the same time reactive towards different types of surface groups. $H_2O$ and $NH_3$ are widely used for oxide and nitride deposition, respectively, as second precursors.

ALD processes typically produce thin films that have lower impurity content at the same deposition temperature than chemical vapor deposition (CVD) processes. Despite the lower impurity levels in ALD films, the impurity content in ALD films can still be a problem. There are several possible reasons for the presence of impurities in thin films deposited by ALD. In some cases, the semiconductor process flow necessarily limits the maximum deposition temperature such that that some residues are left in the film. ALD films deposited from chloride or other halide-containing precursors (e.g., $WF_6$) at relatively low temperatures can comprise relatively high levels of halide residues. Halide impurities are present mainly at the interfaces, which can also lead to problems. In some cases, like low temperature deposition of transition metal nitrides and transition metal carbides from halide containing precursors, the impurity contents can be above the acceptable limit for some integrated circuit (IC) applications. In another example, in some applications amorphous films are needed, which limits the growth temperature.

In some ALD processes a deposited layer comprising Ti, Al, and C can be undesirably oxidized by contaminants such as water and air. In NMOS applications, oxidation of such a layer or thin film may lead to a shift in the workfunction, for example, from N-type to P-type.

SUMMARY OF THE INVENTION

According to some embodiments of the invention, an organosilane, organoborane, silane, or borane (generally referred to herein as a "silane/borane agent") is utilized in atomic layer deposition (ALD) processes for depositing a boron- or silicon-containing film comprising metal carbide from a halide-containing precursor or in treating a deposited film that comprises metal carbide. The silane/borane agent may be pulsed during or after a deposition cycle, or it may be applied to a thin film after some or all cycles have been completed. In some embodiments, the silane/borane agent may serve to reduce oxidized portions of a metal film. In some embodiments, the silane/borane agent may form a barrier to at least partially prevent further oxidation of the film itself or of films subsequently deposited over the treated film. In some embodiments, the silane/borane agent may help in gettering oxygen from deeper within a film, such as oxygen coming from subsequent air exposure.

In some embodiments, the silane/borane treatment may form a capping layer comprising silicon or boron. In some embodiments the capping layer may comprise a portion of the metal carbide layer that comprises silicon or boron. In some embodiments the capping layer is formed directly on the metal carbide layer. In some embodiments the capping layer comprises a portion of the metal carbide film comprising silicon or boron as well as a layer comprising silicon or boron formed on the metal carbide layer.

In some cases, the barrier effect of the silane/borane agent treatment may also prevent or limit oxidation of one or more layers deposited after the silane/borane treatment of the metal carbide film. For example, the use of a silane/borane agent in the formation or treatment of a metal carbide film, such as a titanium carbide film, may limit oxidation of a second film deposited over the titanium carbide film, such as a nitride film (for example TiN) even if the second film is not itself treated with a silane/borane agent. Additional subsequently deposited films may also be protected from oxidation by the silane/borane agent treatment of the metal carbide layer.

In some embodiments, however, additional films deposited after the metal carbide, such as a titanium nitride film, a hafnium oxide film, a silicon or silicon oxide film, or a tungsten film, are themselves treated with a silane/borane agent to achieve at least some of the advantages enjoyed by the treated metal carbide films.

The duration of the silane/borane agent exposure can be controlled to achieve a desired result. For example, the duration of exposure can be based on a desired level of interaction with the metal film and the desired depth of diffusion or penetration into the film. In some embodiments the duration of the exposure is controlled to form a capping layer of a desired thickness and/or composition.

In some embodiments, the silane/borane is selected from the group consisting of organosilanes and organoboranes, monosilane, disilane, trisilane, borane, diborane, and triborane. The silane/borane agent may be provided in each ALD cycle, at intervals during the deposition process, or after the completion of some or all of the cycles. In some embodiments, the silane/borane agent may be provided to the substrate in vapor form. In some embodiments the silane/borane agent, such as trisilane, may be applied to the substrate in liquid form.

In some embodiments, ALD processes for forming a titanium-carbide thin film are disclosed. The processes may comprise contacting a substrate in a reaction space with alternating and sequential pulses of a titanium source chemical that comprises at least one halide ligand, a second source chemical comprising a metal and carbon and a third source chemical, wherein the third source chemical is a silane/borane. As discussed in more detail below, the third source chemical may be applied as a part of each deposition cycle, as a part of only some cycles, or after all the cycles have been completed. The second source chemical may comprise an organic ligand, and in some embodiments may be TMA (trimethylaluminum) or TEA (triethylaluminum). In some embodiments, the second source chemical is dimethylaluminumhydride DMAH or tris(tertbutyl)aluminum TTBA.

In some embodiments, ALD processes for forming a titanium carbide film are disclosed, in which alternating and self-saturating pulses of reactants are provided in a plurality of deposition cycles. Each cycle preferably comprises contacting a substrate in a reaction space with alternating and sequential pulses of a titanium source chemical, preferably a titanium halide compound, a carbon source chemical, and a silane or borane source chemical. The silane or borane source chemical can be selected from monosilane, disilane, trisilane, borane, and diborane, organosilane and organoborane, and in one embodiment is trisilane.

In yet another aspect of the invention, a semiconductor device structure is disclosed. The structure comprises a substrate and a thin film layer overlying the substrate, wherein the thin film layer is formed by ALD by contacting the substrate with alternating and sequential pulses of a metal source chemical, a carbon source chemical, and a silane/borane agent.

BRIEF DESCRIPTION OF THE DRAWINGS

The invention will be better understood from the Detailed Description of the Preferred Embodiments and from the appended drawings, which are meant to illustrate and not to limit the invention, and wherein.

DETAILED DESCRIPTION OF PREFERRED EMBODIMENTS

Figure 1:
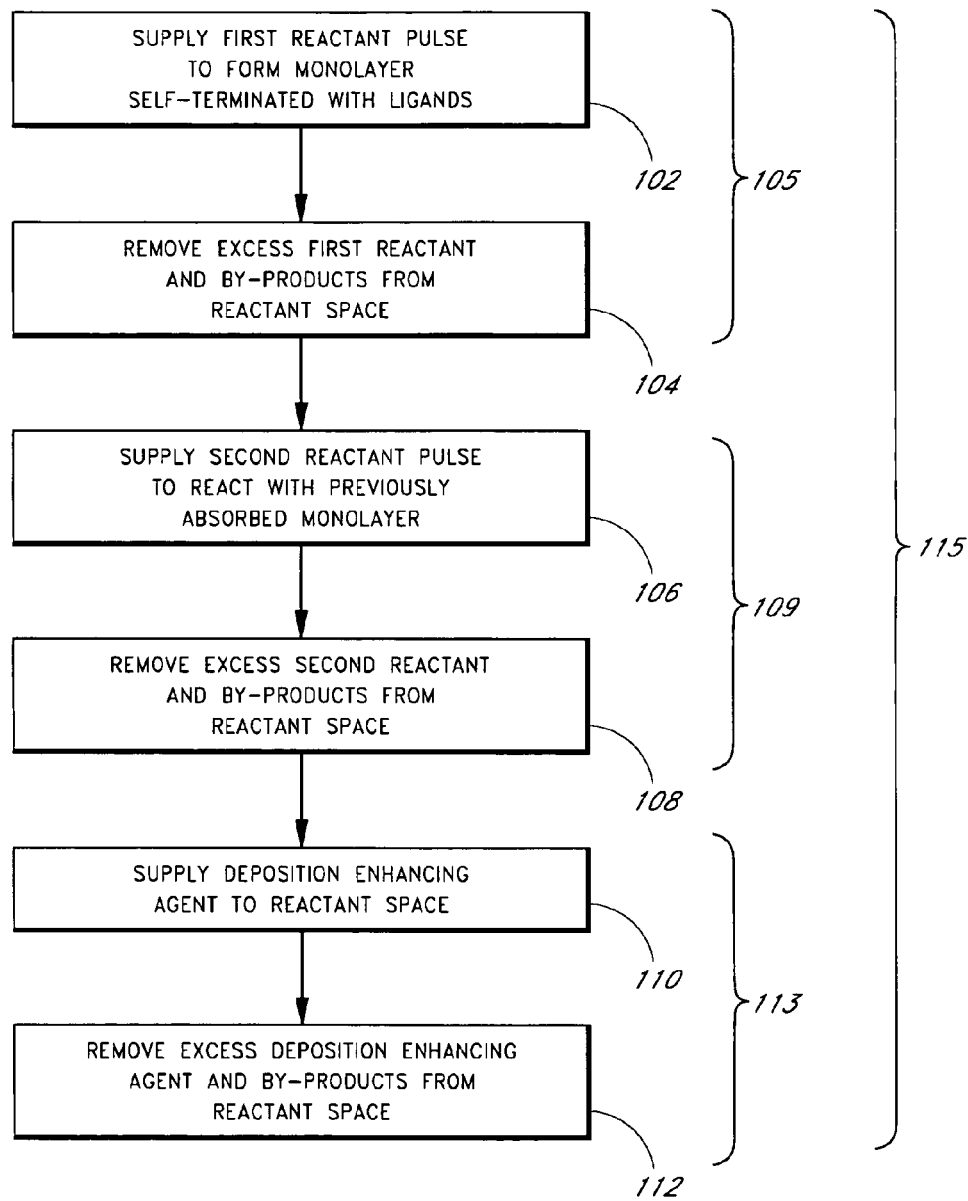
FIG. 1 is a flow chart generally illustrating a method of forming a binary compound by ALD, in which supply of a silane/borane agent follows removal of excess second reactant and by-products, in accordance with some embodiments of the invention.

The present disclosure provides atomic layer deposition (ALD) methods for forming metal carbide thin films, such as titanium carbide thin films. Although described primarily in terms of titanium carbide thin films, other types of thin films may be deposited and/or treated with the disclosed methods, such as niobium carbide films, as discussed in more detail below.

The ALD methods may comprise exposing the films to silane or borane to reduce or substantially prevent oxidation of the titanium carbide film and the accompanying buildup of oxygen at the interface of the titanium carbide film and an overlying layer as well as diffusion of possible oxygen beyond the interface between a titanium carbide film and an underlying layer. As mentioned above, such a buildup of oxidation can cause a shift in the workfunction of the thin film. In some embodiments, a silane or borane treatment can be used to reduce the resistivity of a thin titanium carbide film. The silane or borane may be provided during each titanium carbide deposition cycle, after a certain number of titanium carbide deposition cycles, or after all the titanium carbide deposition cycles have been completed. In some preferred embodiments, the silane or borane agent is a borane or an organoborane, such as diborane, or a silane or organosilate, such as silane, disilane, or trisilane.

Definitions

As used in this disclosure, the term "ALD process" is used in accordance with its ordinary meaning in this field and includes a process for producing thin films over a substrate in which a thin film is formed molecular layer by molecular layer due to self-saturating chemical reactions. The general principles of ALD are disclosed, for example, in U.S. Pat. Nos. 4,058,430 and 5,711,811, the disclosures of which are incorporated herein by reference. In an ALD process, gaseous reactants, i.e., precursors, are conducted into a reaction chamber of an ALD type reactor where they contact a substrate located in the chamber to provide a surface reaction. The pressure and the temperature of the reaction chamber are adjusted to a range where physisorption (i.e. physical adsorption or condensation of gases) and thermal decomposition of the precursors are avoided. Consequently, only up to about one monolayer (i.e. an atomic layer or a molecular layer) of material is deposited at a time during each pulsing cycle. The actual growth rate of the thin film, which is typically presented as A/pulsing cycle, depends, for example, on the number of available reactive surface sites or active sites on the surface and bulkiness of the chemisorbing molecules. Gas phase reactions between precursors and any undesired reactions of by-products are inhibited because precursor pulses are separated from each other by time and the reaction chamber is purged with an inactive gas (e.g. nitrogen or argon) and/or evacuated using, e.g., a pump between precursor pulses to remove surplus gaseous reactants and reaction by-products from the chamber.

As used in this disclosure, the term "reaction space" is used in accordance with its ordinary meaning in this field and includes a reactor or reaction chamber, or an arbitrarily defined volume therein, in which conditions can be adjusted to effect thin film growth by ALD. Typically the reaction space includes surfaces subject to all reaction gas pulses from which gases or particles can flow to the substrate, by entrained flow or diffusion, during normal operation. The reaction space can be, for example, in a single-wafer ALD reactor or a batch ALD reactor, where deposition on multiple substrates takes place at the same time.

As used in this disclosure, the term "adsorption" is used in accordance with its ordinary meaning in this field and includes a chemical attachment of atoms or molecules on a surface.

As used in this disclosure, the term "soak" describes exposing a thin film, such as a titanium carbide film, to a chemical such as a silane/borane agent for a period of about 10 seconds to about 600 seconds, preferably from about 30 seconds to about 300 seconds and more preferably from about 45 seconds to about 180 seconds. In some cases, the duration of a soak is longer than the duration of a pulse of titanium or carbon reactants in an ALD cycle. The duration of a soak may be adjusted to obtain a desired amount of silicon in a metal carbide film. For example the duration of the soak can be adjusted to determine a penetration depth or the extent of diffusion in the metal carbide film. In some embodiments the Si does not necessarily penetrate into the film, as its presence on the surface of the film may serve as an oxygen or oxidation barrier (or nitrogen barrier, for example where a subsequent layer such as a TiN is deposited on the treated film).

As used in this disclosure, the term "thin film" is used in accordance with its ordinary meaning in this field and includes a film that is grown from elements or compounds that are transported as separate ions, atoms or molecules via vacuum, gaseous phase or liquid phase from the source to the substrate. The thickness of the film depends upon the application and may vary in a wide range, preferably from one atomic layer to 1,000 nm or more. In some embodiments, the thin film is less than about 20 nm in thickness, even more preferably less than about 10 nm and most preferably less than about 5 nm or less than about 3 nm.

Subscripts "x" and "y" are used to designate species that are not necessarily stoichiometric, having a wide range of phases with varying metal/oxygen, metal/carbon, metal/nitrogen, or metal/carbon/nitrogen ratios.

ALD Methods

The methods presented herein allow deposition of conformal metal carbide thin films on substrate surfaces. In some embodiments, thin films are deposited from halogen-containing chemicals. Geometrically challenging applications are also possible due to the self-limited nature of the surface reactions in ALD processes.

According to some embodiments, an ALD type process is used to form titanium carbide thin films on substrates, such as integrated circuit workpieces. The surfaces on which the thin titanium carbide (TiC) films are deposited can take a variety of forms. Examples include, but are not limited to, silicon, silicon oxide ($SiO_2$), coated silicon, dielectric materials, low-k materials, metals—such as copper and aluminum—metal alloys, metal oxides and various nitrides, such as transition metal nitrides and silicon nitride or a combination of said materials. In some embodiments, the substrate comprises titanium nitride. In some embodiments, the substrate comprises hafnium oxide.

In a some embodiments, a substrate or workpiece is placed in a reaction chamber and subjected to alternately repeated surface reactions. In particular, thin films are formed by repetition of an ALD cycle. Each ALD cycle is typically self-limiting. In the case of compound metallic thin film deposition, at least two different source chemicals are alternatively employed. One reactant will form no more than about one monolayer on the substrate surface and includes a metal species desired in the layer being deposited. This reactant, also referred to herein as "the metal reactant," is preferably a titanium halide, such as $TiCl_4$, or a niobium halide, such as $NbCl_5$, and thus the deposited monolayer is terminated with halogen ligands.

A second reactant preferably contributes carbon to the growing film. In some embodiments, the second reactant comprises a metal and carbon, such as TMA or TEA. In some embodiments, the second reactant is a metal-containing source chemical comprising at least one ligand, such as a metalorganic compound. Further, in some embodiments the second reactant can also leave some amount of metal in the film being deposited. For example, in the case of TMA or TEA, some amount of aluminum may be left in the film, depending on the particular reaction conditions. In some embodiments, the formation of an aluminum carbide in the form of $Al_xC_y$ may also provide protection against oxidation.

In some embodiments according to the present disclosure, a third reactant is provided every cycle, after a certain number of cycles, or after deposition of the metal carbide film is complete. The third reactant may be a silicon compound, or a boron compound, preferably one that is a strong reducer. In some embodiments the third reactant comprises a silane/borane agent. The silane/borane agent is more reactive to oxygen than is the metal of the metal carbide film, for example titanium and/or niobium, and thus is capable of reducing the amount of metal oxide in the film. In some cases, little or no oxygen is actually removed from the thin film; however, the silane/borane agent acts to reduce metal oxide, such as titanium oxide by breaking the bonds between titanium and oxygen to return the titanium to its pure titanium carbide form. In such cases, although, the oxygen has not actually been removed from the film, it is bound up by the silane/borane agent so as to not impede the workfunction of the thin film. Accordingly, it could also be said that application of a silane/borane agent increases the amount of TiC compared to the amount of TiOC in the film. Moreover, in some embodiments the third reactant also provides a species desired in the thin film, such as silicon, boron, or carbon. However, it should be mentioned that in some embodiments, there will be little or no oxygen for the silane/borane agent to bond with during the deposition process. In such cases, the silicon or boron deposited with the TiC thin film may act as a barrier to oxygen if and when the TiC film is exposed to oxygen, such as when a workpiece is moved from one chamber to another. For example, treatment of a titanium carbide layer during deposition may reduce or prevent oxidation of the titanium carbide layer when it is moved to another reactor for further processing, such as deposition of an overlying titanium nitride layer.

The silane/borane agent may be selected from the group consisting of monosilane, disilane, trisilane, organosilanes, borane, diborane, organoboranes, or any other suitable material that readily reacts with oxygen to reduce titanium, niobium or other metal in the metal carbide. The silane/borane agent may be supplied in vapor or liquid form, and may be applied as a relatively short pulse every cycle or intermittently in the deposition process or as a relatively longer soak to a partially or completely formed titanium carbide layer.

The silane/borane agent may be provided in each ALD cycle, at intervals during the deposition process, or after the deposition process has been completed. For example, in some embodiments the silane/borane agent is provided every one to four ALD cycles. In some embodiments, at the time the silane/borane agent is provided, the film grown in the most recent ALD cycles is preferably thin enough that the silane/borane agent can penetrate the film. In some embodiments, such as situations where more than one deposition cycle has been completed prior to exposure to the silane/borane agent, the amount of silane/borane penetration in the films can be controlled by the quantity or concentration of the agent used or the duration of the exposure.

The silane/borane agent may be provided as a part of one or more cycles or may be applied after one or more cycles have been completed. Thus, in some embodiments, the deposition of a metal carbide film, such as TiC, is considered to be a cycle in an ALD process independent of the application of a silane/borane agent. In such cases, the cycle is repeated as many times as desired, and the silane/borane treatment is applied after some or all of the cycles. However, in some embodiments, the silane/borane agent is applied during one or more cycles (as a part of an ALD cycle) as well as after one or more cycles (separate from an ALD cycle).

In one phase of an ALD cycle ("the metal phase", for example "the titanium phase" or the "first phase"), the reactant or source chemical comprising titanium (or other metal such as niobium) is supplied to the reaction chamber and chemisorbs to the substrate surface. The reactant supplied in this phase is selected such that, under the preferred conditions, the amount of reactant that can be bound to the surface is determined by the number of available binding sites and by the physical size of the chemisorbed species (including ligands). The chemisorbed layer left by a pulse of the titanium reactant is self-terminated with a surface that is non-reactive with the remaining chemistry of that pulse. This phenomenon is referred to herein as "self-saturation." One of skill in the art will recognize that the self-limiting nature of this phase makes the entire ALD cycle self-limiting. Excess reactant and reactant byproducts (if any) are removed from the reaction space, for example by purging with an inert gas and/or evacuation.

Maximum step coverage and conformality on the workpiece surface is obtained when no more than about a single molecular layer of metal source chemical molecules is chemisorbed in each self-limiting pulse. Due to the size of the chemisorbed species and the number of reactive sites, somewhat less than a monolayer may be deposited in each pulse of metal reactant. However, the use of some reactants, such as TEA or TMA, may result in more than a monolayer because they may at least partially self-decompose at the deposition temperature. The degree of self-decomposition can be a function of pulse time.

In the next phase of the cycle, a pulse of a second source chemical is provided that reacts with the molecules left on the substrate surface by the preceding pulse. In some embodiments the source chemical preferably comprises carbon that is to be incorporated in the thin film. The carbon is incorporated into the thin film by the interaction of the source chemical with the monolayer left by the metal reactant. This phase is referred to herein as "the second phase" or the "carbon-contributing phase." In some embodiments, the second source chemical is a carbon containing compound and its reaction with the chemisorbed metal species produces a metal carbide layer on the substrate. In some embodiments the second source chemical also comprises a second metal, such as aluminum, and the second metal is incorporated into the growing film along with the carbon. In some embodiments the species-contributing source chemical comprises metal and carbon and may be, for example, TMA or TEA.

Excess second source chemical and reaction byproducts, if any, are removed from the reaction space by purging and/or evacuation.

In some embodiments, a third phase of the ALD cycle comprises providing the silane/borane agent. The silane/borane agent may comprise a species that may be incorporated into the thin film, such as boron or silicon. This is referred to as the "third phase" or the "oxygen isolation phase."

Although referred to as the "first phase," the "second phase" and the "third phase," these labels are for convenience and do not indicate the actual order of the phases in each ALD cycle. Thus, the initial ALD cycle may be started with any of the three phases described above. However, one of skill in the art will recognize that if the initial ALD cycle does not begin with the metal reactant phase, at least two ALD cycles will typically need to be completed to deposit about a monolayer of the desired metal carbide thin film.

In addition, the order of the phases may be changed. That is, in some embodiments the silane/borane agent may be the next reactant provided after the second reactant, while in other embodiments the silane/borane agent may be the next reactant provided after the first metal source reactant. And in some embodiments, the silane/borane agent may be supplied after only some cycles or after all cycles have been completed. For example, in some embodiments the third phase (provision of the silane/borane agent) may immediately follow the first phase (provision of the reactant comprising a metal species), which in turn is followed by the carbon-contributing phase. And in some embodiments, the third phase may be supplied as a vapor "soak" after the thin film has been completely formed. That is, the deposited film is exposed to a silane or a borane in vapor form for a period of time. A phase is generally considered to immediately follow another phase if only a purge or other reactant removal step intervenes.

In some embodiments the silane/borane agent is not provided in every ALD cycle. Rather, a partially or completely deposited titanium carbide film may be treated with a silane/borane agent. This may be the case, for example, where a first film has been formed using $TiCl_4$ and TEA but the resulting TiAlC film has been oxidized by water, air, or some other contaminant source to form a layer that is essentially TiAlOC. A silane/borane agent can be applied to the first film which may reduce the TiAlOC layer back to essentially TiAlC with only the minor presence of impurities.

In one embodiment, an ALD cycle comprises:
1. providing a titanium halide to the reaction space;
2. substantially purging and/or evacuation of excess titanium halide and reaction byproducts;
3. providing a carbon-contributing reactant to the reaction space, such TEA or TMA;
4. substantially purging and/or evacuation of excess second reactant and reaction byproducts; and
5. providing a silane/borane agent to the reaction space.

Step 5 can be included in each ALD cycle, or steps 1-4 can be repeated several times before step 5 is introduced. In some embodiments steps 1-4 are repeated up to 10 times before step 5 is included. In other embodiments steps 1-4 are repeated up to 100 or even 1000 or more times before step 5 is included. In some embodiments, a complete film of desired thickness is deposited prior to step 5.

With reference to FIG. 1, in an embodiment of the invention, after initial surface termination, if necessary, a first reactant or source chemical pulse is supplied 102 to the substrate or workpiece. In the illustrated embodiment, the first reactant is a metal halide, and the thin film being formed comprises a metal carbide. In accordance with a preferred embodiment, the first reactant pulse comprises a carrier gas flow and a volatile titanium halide species that is reactive with the workpiece surfaces of interest. Accordingly, the halogen-containing titanium species adsorbs upon the workpiece surfaces. The first reactant pulse self-saturates the workpiece surfaces such that any excess constituents of the first reactant pulse do not further react with the monolayer formed by this process. Self-saturation results due to halide tails terminating the monolayer, protecting the layer from further reaction.

The first reactant is then removed 104 from the reaction space. Step 104 may entail merely stopping the flow of the first reactant or chemistry while continuing to flow a carrier gas for a sufficient time to diffuse or purge excess reactants and reactant by-products from the reaction space. Preferably the removal 104 comprises continuing to flow purge gas for between about 0.1 seconds and 20 seconds after stopping the flow of the first reactant pulse. Inter-pulse purging is described in co-pending U.S. Pat. No. 6,511,539, entitled "IMPROVED APPARATUS AND METHOD FOR GROWTH OF A THIN FILM," the disclosure of which is incorporated herein by reference. In other arrangements, the chamber may be pumped down between alternating chemistries. See, for example, PCT publication number WO 96/17107, published Jun. 6, 1996, entitled "METHOD AND APPARATUS FOR GROWING THIN FILMS," the disclosure of which is incorporated herein by reference. Together, the adsorption 102 and reactant removal 104 represent a first phase 105 in an ALD cycle. The first phase in the illustrated ALD cycle is thus the metal phase.

With continued reference to FIG. 1, a second reactant or source chemical pulse is then supplied 106 to the workpiece. The second chemical reacts with the monolayer left by the first reactant. In the illustrated embodiment, this second reactant pulse 106 comprises supplying a carrier gas with the second source gas to the workpiece. In particular, where the first reactant comprises a titanium halide, the second reactant, such as TMA or TEA, comprises carbon and a second, different metal. In the case of TEA or TMA the second reactant leaves no more than about a monolayer of TiAlC. The second reactant preferably removes at least some halide ligands from the adsorbed first reactant. The second reactant pulse 106 also leaves a surface termination that operates to limit the deposition in a saturative reaction phase.

After a time period sufficient to completely saturate and react the monolayer with the second reactant pulse 106, any excess second reactant is removed 108 from the workpiece. As with the removal 104 of the first reactant, this step 108 may comprise stopping the flow of the second chemistry and continuing to flow carrier gas for a time period sufficient for excess reactants and volatile reaction by-products from the second reactant pulse to diffuse out of and be purged from the reaction space. Together, the second reactant pulse 106 and removal 108 represent a second phase 109 in the illustrated process, and can also be considered a carbon and metal species-contributing phase.

When the excess reactants of the second reactant pulse have been removed 108 from the chamber, a third reactant or source chemical pulse may be supplied to the workpiece 110. The third reactant can be a silane/borane agent capable of removing halides and/or reacting with oxygen in the growing film. Examples of suitable silanes and boranes include monosilane, disilane, trisilane, borane, and diborane. The silane/borane agent may be provided with an inert carrier gas. Temperature and pressure conditions can be adjusted to control the level of diffusion of the silane/borane agent through the monolayer.

After a time period sufficient to achieve a desired level of saturation of the third reactant in the monolayer, excess unreacted silane/borane agent and any reaction by-products (which may also be volatile) are removed 112 from the reaction space, for example by a purge gas pulse. The removal can be as described for step 104. Together, the silane/borane agent pulse 110 and removal 112 represent a third phase 113 of the illustrated ALD process, which can also be referred to as the oxygen isolation phase.

In some embodiments, supply of silane/borane agent immediately follows the step of removing excess first reactant and by-products. After a time period sufficient to react the monolayer with the silane/borane agent, excess unreacted silane/borane agent and reaction by-products are removed from the reaction space, possibly by a purge gas pulse. The removal step is followed by supply of the second reactant pulse.

In some embodiments of the disclosure (not shown), the steps of supplying the silane/borane agent and removing any excess silane/borane agent and by-products precede the step of supplying the first reactant. In some embodiments, the silane/borane agent is not provided in every cycle or may be provided after all the cycles are complete.

In some embodiments, the step of supplying a silane/borane agent take the form of a soak occurring after some or all of the titanium carbide deposition cycles have been completed. In some cases, a soak of trisilane occurring after deposition of a TiC film is completed has been found to achieve suitable results.

In one embodiment, a process for forming a titanium carbide film comprises:

1. providing a titanium halide, such as a titanium chloride, to the reaction space;
2. substantially purging and/or evacuation of excess titanium halide and reaction byproducts;
3. providing a second carbon and aluminum-contributing reactant, such as TEA or TMA, to the reaction space;
4. substantially purging and/or evacuation of excess second reactant and reaction byproducts;
5. repeating steps 1 through 4 for either a desired number of cycles or until a film of a desired thickness has been achieved; and
6. soaking the product of step 5 with a silane/borane agent In some embodiments the soak of Step 6 can be configured to achieve a particular level of interaction between any oxygen present in the film and the silane/borane agent. In some embodiments the soak of Step 6 can be configured to provide a desired amount of silicon or boron in the film to a particular depth. For example, the soak may last long enough to allow silicon or boron to substantially diffuse throughout the film or the soak's duration may be kept shorter so as to reach only a partial depth in the film. The duration of the soak may be from about 5 seconds to about 600 seconds, preferably from about 10 seconds to about 180 seconds, more preferably from about 20 seconds to about 120 seconds and in some embodiments from about 30 seconds to about 60 seconds. In some cases, such as batch processes, the soaking time might be even longer. In some such embodiments, the soak is performed for about 30 seconds to about 600 seconds, preferably from about 45 seconds to about 180 seconds, more preferably from about 60 seconds to about 120 seconds.

In some embodiments, a soak may serve to "cap" a thin film with an oxygen barrier by providing silicon or boron in a portion of the film or on the film itself. In some embodiments, a deposited or partially deposited metal carbide layer is soaked in a silane/borane agent, such as disilane or trisilane, to form a thin "capping" layer having a thickness below about 3 nm, more preferably below about 2 nm and most preferably below about 1 nm. Formation of a capping layer in the initial phase of the soak may stop the diffusion of silicon or boron into the film while still having a beneficial effect on the surface of the film.

According to some embodiments, the capping layer is a separate layer comprising silicon or boron and formed directly on the thin film. In some embodiments, the capping layer may also or alternatively comprise a portion of the metal carbide layer, or whatever layer it is applied to, where that portion comprises silicon or boron from the treatment with the silane or borane agent. The nature of the capping layer may depend, for example, on the treatment conditions and/or the silane/borane agent that is used. Where the capping layer comprises a portion of the underlying metal layer, such as a metal carbide layer, there may be a gradient within the underlying layer with a greater concentration of the silicon or boron toward the top of the layer and a decreasing concentration at increased depths from the top of the layer. The gradient—both the depth to which the silane/borane agent extends as well as the concentration at any given depth—may depend, in part on the treatment conditions (duration, temperature, pressure, etc.) and the particular silane/borane agent used. According to some embodiments, the silane/borane agent may at least partially react with the underlying layer. In some cases, the capping layer may comprise a layer comprising silicon or boron formed directly on the underlying film as well as a portion of the film in which silicon or boron is present. In some embodiments the capping layer is a silicon or boron layer formed directly over and contacting a metal carbide layer, such as a TiC layer.

According to some embodiments, the reaction temperature may be from about 300° C. to about 500° C., preferably from about 325° C. to about 450° C., and more preferably from about 350° C. to about 450° C.

The foregoing embodiments will be discussed in the context of specific thin film chemistries.

Deposition of Carbon-Containing Films

Carbon containing metal films or metal carbides have varying applications, such as gate electrodes, electrodes in capacitors and barrier layers in damascene and dual damascene structures.

In some embodiments, a general pulsing sequence for carbon-containing metal or metal carbide thin film deposition is:

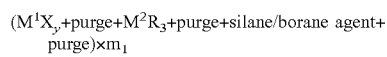

or

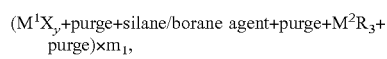

wherein $m_1$ is the number of total cycles. $M^1$ is a metal atom, preferably selected from the group consisting of Ti, Zr, Hf, V, Nb, Ta, Cr, Mo, W.

$M^2$ is a metal atom, preferably selected from the group consisting of B, Al, In, Bi, Sn, Zn, Pb, Sb and Ga. R is a ligand for $M^2$ and can be any ligand, preferably a metalorganic ligand, more preferably an organometallic ligand, most preferably an alkane ligand, such as ethyl ligand.

$X_y$ is one or more ligands for $M^1$. Each X may be a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkyl (for example, methyl, ethyl, propyl, and butyl), carbonyl, cyclo-octadiene, benzene or hydrogen ligand. In other embodiments $X_y$ may comprise mixtures thereof. However, at least one of the $X_y$ ligands is preferably a halogen. As an example, bis(cyclopentadienyl)hafnium dichloride or bis(cyclopentadienyl)tantalum(V) trichloride, can be used as a metal precursor in some embodiments. In some embodiments no X is oxygen or nitrogen.

The silane/borane agent may be selected from the group consisting of monosilane, disilane, trisilane, borane, and diborane. In some embodiments, the silane/borane agent is a disilane or a trisilane that is applied during or after each layer is deposited, after only some layers are deposited, or after all the layers have been deposited. The silane/borane agent can be applied in a pulse or as a soak and as a liquid or a vapor.

In preferred embodiments, $M^2$ is a metal, preferably aluminum, and R is a carbon-containing ligand. $M^2R_3$ preferably has at least one metal-to-carbon bond. In some embodiments, $M^2R_3$ may be considered a carbon source chemical. In some embodiments, $M^2R_3$ is selected from the group consisting of TMA and TEA. In some embodiments $M^2R_3$ is DMAH. In some embodiments $M^2R_3$ is TTBA.

One benefit of the ALD processes of some embodiments is that the growth rate is extremely high for an ALD process. For example, the growth rate for TaC formation can be over 2 Å/cycle. Further, annealing can be performed after the metal carbide deposition for enhancing the properties of the film. Suitable atmospheres, such as $N_2$ or forming gas ($N_2/H_2$), may be used during annealing.

Exemplary pulsing sequences for TiC film formation include:

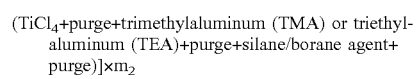

and

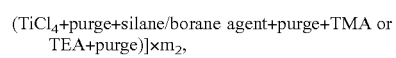

wherein $m_2$ is the number of total cycles and the silane/borane agent is selected from the group consisting of monosilane, disilane, trisilane, borane, and diborane.

Films deposited using the above exemplary pulsing sequence contained, based on an atomic basis, about 17-20% Ti, about 17-27% Al, about 16-42% Si, and about 21-39% C. These values were determined using Rutherford backscattering spectrometry, or RBS.

In other embodiments, a silane/borane agent is not utilized every cycle but only in some of the cycles. In this situation, a general pulsing sequence for carbon-containing metal thin film deposition can be:

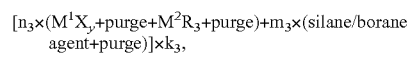

wherein $n_3$ is the number of carbide cycles in one total cycle, $m_3$ is the number of cycles in which a silane/borane agent is used in one total cycle, and $k_3$ is the number of total cycles. $M^1$ is preferably Ti but may be a metal atom selected from the group consisting of Zr, Hf, V, Nb, Ta, Cr, Mo, and W. $M^2$ is preferably Al but may be a metal atom selected from the group consisting of B, Al, In, Sn, Bi, Zn, Pb, Sb and Ga. R is a ligand for $M^2$ and can be any ligand.

$X_y$ is one or more ligands for $M^1$. Each X is preferably a halogen ligand selected from the group consisting of I, Br, Cl and F. However, in some embodiments at least one X can be a metalorganic ligand, such as a cyclopentadienyl (for example, cyclopentadienyl, methylcyclopentadienyl, pentamethylcyclopentadienyl, ethylcyclopentadienyl, isopropylcyclopentadienyl, tertbutylcyclopentadienyl, and indenyl), alkyl (for example, methyl, ethyl, propyl, and butyl), carbonyl, cyclo-octadiene, benzene or hydrogen ligand. In other embodiments $X_y$ may comprise mixtures thereof. However, at least one of the $X_y$ ligands is preferably a halogen. As an example, bis(cyclopentadienyl)hafnium dichloride or bis(cyclopentadienyl)tantalum(V) trichloride, can be used as a metal precursor in some embodiments. In some embodiments no X comprises nitrogen or oxygen.

According to some embodiments, the reaction temperature may be from about 300° C. to about 500° C., preferably from about 325° C. to about 450° C., and more preferably from about 350° C. to about 450° C.

The exact composition of a thin film produced using the methods and materials disclosed herein may vary. Titanium carbide films fabricated according to the present disclosure may contain a number of differing elemental components including, but not limited to titanium, aluminum, carbon, silicon and/or boron depending in part on the type of silane/borane agent used.

In some embodiments, the atomic percentage of titanium, or other suitable metal, could be from about 10-30%, about 10-25%, or even about 15-20%. In some embodiments, the atomic percentage of aluminum could be greater than about 15%, greater than about 20%, or even greater than about 25%. In some embodiments, the atomic percentage of silicon or boron could be greater than about 10%, greater than about 25%, or greater than about 35%. In some embodiments, the atomic percentage of carbon could be less than about 40%, less than about 30%, or less than about 25%.

In some embodiments, a metal carbide film comprise, on an atomic basis, about 10-30% titanium, greater than about 15% aluminum, greater than about 10% silicon or boron, and less than about 40% carbon. In some embodiments, a metal carbide film comprise, on an atomic basis, about 10-25% titanium, greater than about 20% aluminum, greater than about 25% silicon or boron, and less than about 30% carbon. In some embodiments, a metal carbide film comprise, on an atomic basis, about 15-20% titanium, greater than about 25% aluminum, greater than about 35% silicon or boron, and less than about 25% carbon.

In some embodiments, the atomic percentage of titanium, or other suitable metal, could be from about 10-50%, about 15-45%, or even about 20-40%. In some embodiments, the atomic percentage of aluminum could be less than about 15%, less than about 10%, or even less than about 5%, and in some cases below about 1%, such as about ~0%. In some embodiments, the atomic percentage of silicon or boron could be greater than about 25%, greater than about 35%, or greater than about 45%. In some embodiments, the atomic percentage of carbon could be less than about 20%, less than about 10%, or less than about 5%, and in some cases below about 1%, even about ~0%.

In some embodiments, the total combined percentage of silicon, boron and aluminum in the film comprises more than about 20%, preferably more than about 30% and more preferably more than about 40% and, if desired, in some case more than about 45%.

A variety of compositions are possible. For example, in some embodiments it may be desirable to fabricate a thin film having a composition where only one or some elements fall into any of the "preferable," "more preferable," or "most preferable" ranges.

In some embodiments of the present disclosure, the disclosed deposition methods can be used to form various stacks including, but not limited to, NMOS stacks in the process of making a gate. For example, in some embodiments, NMOS stacks containing TiC thin films fabricated using the methods disclosed herein exhibit a leakage ($J_g$) (at −1V stress) of less than about $10^{-2}$ A/cm$^2$, less than about $10^{-3}$ A/cm$^2$, or less than about $3*10^{-4}$ A/cm$^2$.

In some embodiments of the present disclosure, titanium carbide (TiC) films can be formed in dielectric/metal stack in which the equivalent oxide thickness, or EOT, of the stack can be less than about 1.3 nm, less than about 1.2 nm, preferably less than about 1.1 nm, or less than about 1.05 nm.

In some embodiments of the present disclosure, TiC films can be formed in which the effective workfunction, or eWF, can be from about 4.0 to about 4.4 eV, from about 4.05 to about 4.35 eV, or from about 4.1 to about 4.25 eV.

In some embodiments, the use of a silane/borane agent such as a silane (e.g., disilane or trisilane) can reduce the resistivity of a TiC thin film relative to a TiC film to which a silane/borane agent is not exposed. In some embodiments, the resistivity is reduced up to or as much as about 30%, up to or as much as about 40%, or up to or as much as about 50%.

Use of a silane/borane agent as disclosed herein also has the potential of providing a thin film, such as a TiC, with resistance to oxidation. In some embodiments, it is believed, without being held to any theory, that resistance to oxidation has been increased even when the films are subjected to subsequent processing or the atmosphere. Without being tied to any particular theory, it is believe that resistance to oxidation is reduced because the silane/borane agents tend to decrease the amount of carbon in the thin film as it is partially replaced by silicon or boron or some other element comprising the silane/borane agent.

Oxidation resistance is important because even a minor amount of oxygen in the stack could change the stack's electrical properties, namely eWF, making them unsuitable for intended purposes. Moreover, deposition of the stack without exposure to air or ambient moisture can be costly, difficult, and/or too complex. Thus, achieving the same or similar results using a silane/borane agent greatly simplifies deposition process while also controlling costs.

Semiconductor Device Applications

Methods of fabricating semiconductor device structures will now be discussed. Although described in terms of several specific contexts, one of skill in the art will recognize that the processes described herein are applicable to many other contexts as well.

The ALD processes disclosed herein may be successfully applied to fabricate NMOS transistors including planar devices as well as multiple gate transistors, such as FinFET.

Carbon-Containing Films as Electrodes

Figure 2:
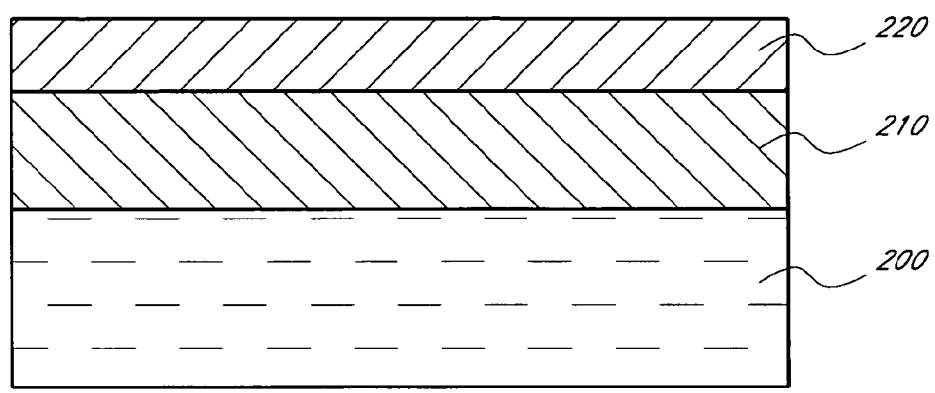
FIG. 2 is a schematic cross-sectional side view of a electrode structure, comprising a layer of a conductive metal carbide, according to some embodiments of the invention.

In some embodiments an electrode is formed by ALD of a conductive metal carbide, such as TiC. With reference to FIG. 2, a layer of high-k dielectric material 200 is deposited onto a substrate (not shown). The substrate may be treated prior to deposition of the high-k material. For example, in some embodiments, a thin interfacial layer (not shown) may be deposited prior to deposition of the high-k material. In one embodiment a thin chemical oxide or oxynitride is formed on the surface. In other embodiments a thermal oxide is grown on the substrate.

"High-k" generally refers to a dielectric material having a dielectric constant (k) value greater than that of silicon oxide. Preferably, the high-k material has a dielectric constant greater than 5, more preferably greater than about 10. Exemplary high-k materials include, without limitation, $HfO_2$, $ZrO_2$, $Al_2O_3$, $TiO_2$, $Ta_2O_5$, $Sc_2O_3$, lanthanide oxides and mixtures thereof, silicates and materials such as YSZ (yttria-stabilized zirconia), barium strontium titanate (BST), strontium titanate (ST), strontium bismuth tantalate (SBT) and bismuth tantalate (BT). Preferably, the high-k material is also deposited by an ALD process.

A layer or thin film 210 of a material such as TiN may be deposited over the dielectric layer. Such a layer may act as an etch stop layer in which the etching has been previously performed in another reactor or in a other facility altogether. The transfer from one reactor or facility to another can expose the thin films to contaminants such as water or air. The water or air generally oxidizes any exposed layer such as TiN transforming the layer into essentially TiON. Such contamination can interfere with the workfunction of the eventual stack.

A layer or thin film of conductive metal carbide 220, such as TiC, is deposited over the layer 210 by ALD, as described above, to form the illustrated structure. It will be appreciated that in the illustrated embodiment the layers are not necessarily drawn to scale. The metal carbide, thin layer of TiN, and underlying high-k material are patterned to form an electrode.

The metal carbide thin film 220 is preferably deposited over the thin film 210 by contacting the substrate with alternating pulses of a metal source chemical, carbon source chemical and a silane/borane agent (not necessarily in this order) or by depositing a complete metal carbide film by ALD and then treating the resulting film with a silane/borane agent, as described above. The metal source chemical is preferably a halide compound (e.g., $TiCl_4$) and the carbon source chemical is preferably an organometallic compound, such as, e.g., trimethylaluminum (TMA).

In some embodiments, the thin layer of TiN is treated with a silane/borane agent. This can be done in addition to treating the metal carbide film with a silane/borane agent or forming the metal carbide film utilizing a silane/borane agent. The silane/borane agent can reduce the thin film 210. If comprising TiON, a silane/borane agent reduces the thin film back to essentially TiN. In this manner the work function may be improved or maintained as what it was before the oxidation occurred. And the presence of the silane/borane agent in the resulting carbide layer can actually provide other benefits such as reduced resistivity. The silane/borane agent may be selected from the group including silanes (e.g., $SiH_4$, $Si_2H_6$, or $Si_3H_8$) and boranes (e.g., $B_2H_6$).

The thicknesses of the various layers in the stack may vary, though in some embodiments, such as the one illustrated in FIG. 2, layer 210 may have a thickness of about 10 Å to about 20 Å, preferably about 15 Å. And layer 220 may have a thickness generally greater than the thickness of layer 210. The use of a protective treatment as presently disclosed can have particular utility where the thicknesses of the various layers in a stack, such as the one illustrated in FIG. 2, are reduced to achieve smaller electronic devices and circuitry. This is because thinner layers are more prone to oxygen diffusing through them. And, in some embodiments, the use of a silane/borane agent does not appreciably increase the overall thickness of the stack.

When forming the metal carbide film, unreacted source chemicals and reaction by-products are removed from the reaction chamber after each source chemical pulse, for example by evacuation and/or purging with an inert gas (e.g., $N_2$). In some embodiments, evacuation is achieved using a vacuum pump or a plurality of vacuum pumps. The pulsing cycle, which can include a silane/borane agent in at least some cycles, is repeated until a metal carbide layer of the desired thickness has been formed. In some embodiments, a silane/borane agent is also or only applied after all the cycles have been completed. The silane/borane agent may be applied either as a pulse or a soak. In some embodiments, it may be preferably to apply the silane/borane agent as a soak after all the cycles have been completed. And preferably, the metal carbide layer has a thickness between about 5 Å and about 1000 Å.

The conductive metal carbides deposited to form the electrode in these embodiments are preferably selected from the group consisting of Ti, Zr, Hf, V, Nb, Ta, Cr, Mo, and W.

In some embodiments the metal carbide forms the electrode. In other embodiments (not shown) another conductive material, such as a metal or poly-Si, is deposited over the metal carbide. The additional conductive material may be deposited by ALD or by another deposition process, such as by CVD or PVD. The deposition may be selective, or may be followed by patterning steps. According to still another embodiment, annealing can be performed after the metal carbide deposition. Suitable atmospheres, such as $N_2$ or forming gas ($N_2/H_2$) are apparent to skilled artisan.

Further processing steps, such as spacer deposition and source/drain implantation, will be apparent to the skilled artisan.

EXAMPLE 1

TiC Films

Using the methods disclosed here in, various titanium carbide thin films were deposited. The thin film was then analyzed using Rutherford backscattering spectrometry, or RBS, to determine the composition of the various films.

After analyzing the various films, it was determined that they the following ranges of compositions on an atomic basis: about 17-20% Ti, about 17-27% Al, about 16-42% Si, and about 21-39% C.

EXAMPLE 2

TiAlC and TiAlSiC in a Single Wafer Reactor

Titanium-aluminium carbide (TiAlC) and titanium-aluminum-carbide-silicon (TiAlSiC) thin films were deposited by Atomic layer deposition (ALD) in Pulsar® 2000 R&D reactor using $TiCl_4$ as the titanium source and $Al(CH_2CH_3)_3$ as the aluminum and carbon source for the TiAlC films and in addition disilane ($Si_2H_6$) or trisilane ($Si_3H_8$) was used as a silicon source for TiAlSiC films.

TiAlC and TiAlSiC films were deposited using alternate and sequential pulses of $TiCl_4$ and $Al(CH_2CH_3)_3$ and in the case of TiAlSiC films additional alternate and sequential pulses of disilane ($Si_2H_6$) or trisilane ($Si_3H_8$) were provided. TiAlC films were also soaked with disilane ($Si_2H_6$) or trisilane ($Si_3H_8$) for about 1 minute. Films were deposited and treated at a reaction temperature of about 415° C. $TiCl_4$ was pulsed for 0.05 s and purged for 5 s. $Al(CH_2CH_3)_3$ was pulsed for 0.5 s and purged for 5 s. $Si_2H_6$ or $Si_3H_8$ was pulsed for 0.5 s and purged for 5 s. The $Al(CH_2CH_3)_3$ was heated to 60° C. and $TiCl_4$ was at room temperature. Carrier gas was ultrapure $N_2$ and the flow used was 0.6 slm.

Some of the films were deposited on thermal $SiO_2$/Si substrates while others were deposited on 2-3 nm $HfO_2$/0.4 nm $SiO_2$/Si substrate with or without a TiN intermediate layer (75 cycles) on top of a $HfO_2$ layer. The TiN intermediate layer was deposited before TiAlC or TiAlSiC film deposition. Substrates having 2-3 nm $HfO_2$/0.4 nm $SiO_2$/Si and the optionally deposited TiN intermediate layer were used to electrically characterize the films. Further another TiN layer (250 cycles) was deposited on top of the TiAlC or TiAlSiC layers. All TiN layers were deposited using $TiCl_4$ and $NH_3$ as a precursors in the same reaction chamber in which TiAlC or TiAlSiC film deposition took place without moving the substrate out of the reaction chamber. This resulted in a stack structure of 6-8 nm TiN/3-4 nm TiAlSiC or TiAlC/(optional 2-2.5 nm TiN/) 2-3 nm HfO$_2$/0.4 nm SiO$_2$/Si measured by transmission electron microscopy (TEM) from the cross sectional area of the samples. After stack depositions, platinum dots were deposited by physical vapor deposition (PVD) on top of the samples, then the TiN, TiAlSiC, and TiAlC layers were etched away from the area between the platinum dots forming a capacitor array with circular top electrodes. These capacitor structures were used to determine the effective work function of the TiAlSiC or TiAlC layer, the equivalent oxide thickness and the leakage current density of the stacks, which represent important properties and quality of the films, although results from capacitor structures might not be directly comparable or transferrable to results of NMOS transistor structures.

The results and properties of the deposited TiAlC and TiAlSiC films are shown in Table 2. The growth rate of the deposited films ranged from about 2.55 to 3.8 Å/cycle on 20 nm thermal SiO$_2$/Si substrates and the resistivity ranged from 1300 to 3800 μΩcm. It may be noted that the soak with disilane or trisilane formed a silicon layer on top of the TiAlC layer (though, the silane may also have penetrated or diffused through a portion o the TiAlC layer or even the whole layer); therefore the growth rate is not shown in the table. The films were measured by Rutherford backscattering spectroscopy (RBS) to find out elemental composition. The effective work functions (eWF) of the TiAlC and TiAlSiC layers ranged from 4.20 to 4.33 eV, the equivalent oxide thicknesses ranged from 1.04 to 1.20, and the leakage current densities ranged from 5.17×10$^{-3}$ A/cm$^2$ to 1.69×10$^{-5}$ A/cm$^2$. Further it was assumed that the stability against ambient oxygen in air or oxidation or further (moisture and/or oxygen) might potentially have been increased, believed to be true without being bound to any theory, due to reduced carbon content in TiAlSiC films.

The results achieved with the TiAlSiC films made with Si$_3$H$_8$, either incorporating Si$_3$H$_8$ into growth cycles or with subsequent soaking of the film, were the most desirable ones for end use in NMOS transistors, as those had lowest effective work function and low resistivity while still maintaining reasonably low leakage and low EOT and potentially good oxidation resistance. Also the TiAlSiC films made with Si$_2$H$_6$ either incorporating Si$_2$H$_6$ into growth cycles or with soaking are acceptable or better than the TiAlC films because of the increased oxidation resistance as explained above and the lower resistivity.

TABLE 2

Properties of TiAlC and TiAlSiC films.

| Film | Growth rate (Å/cycle) | Resistivity (μΩcm) | Composition (RBS) | eWF (eV) | EOT (nm) | Leakage at −1 V (A/cm$^2$) |
|---|---|---|---|---|---|---|
| TiAlC | 3.14-3.80 | 3500-3800 | Ti 18 at-%, Al 38 at-%, C 42 at-%, H 2 at-%, | 4.31-4.33 | 1.05-1.14 | 1.69 × 10$^{-5}$-4.12 × 10$^{-4}$ |
| TiAlSiC + Si$_3$H$_8$ | 2.55-3.73 | 1300-1800 | Ti 17 at-%, Al 17-21 at-%, Si 26-42 at-%, C 21-34 at-%, H 1 at-%, Cl 0.5-1 at-% | 4.20-4.28 | 1.11-1.20 | 1.01 × 10$^{-4}$-5.17 × 10$^{-3}$ |
| TiAlSiC + Si$_2$H$_6$ | 3.20-3.80 | 1400-2500 | Ti 17-20 at-%, Al 20-27 at-%, Si 16-24 at-%, C 35-39 at-%, H 1 at-%, Cl 0.5 at-% | 4.30 | 1.04 | 3.05 × 10$^{-4}$ |
| TiAlC + Si$_3$H$_8$ soak for 60 s | — | — | — | 4.24-4.33 | 1.12-1.19 | 2.94 × 10$^{-4}$-4.80 × 10$^{-3}$ |
| TiAlC + Si$_2$H$_6$ soak for 60 s | — | — | — | 4.32 | 1.06 | 1.64 × 10$^{-4}$ |

In all of the aforesaid embodiments, any element used in an embodiment can interchangeably be used in another embodiment unless such a replacement is not feasible.

It will be understood by those of skill in the art that numerous and various modifications can be made without departing from the spirit of the present invention. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of treating a nitride thin film on a substrate to form a capping layer comprising silicon or boron, the method comprising:
   exposing the nitride thin film to a silane compound or a borane compound, such that a capping layer comprising silicon or boron is formed,
   wherein the capping layer at least partially prevents further oxidation of the nitride thin film during subsequent processing or of films subsequently deposited over the treated film.

2. The method of claim 1, wherein the nitride thin film comprises a metal nitride.

3. The method of claim 2, wherein the nitride thin film comprises titanium nitride.

4. The method of claim 1, wherein silicon or boron is incorporated into a portion of the nitride thin film to form the capping layer.

5. The method of claim 4, wherein the portion of the nitride thin film comprises a gradient of silicon or boron with a greater concentration of silicon or boron toward the top of the layer.

6. The method of claim 1, wherein the capping layer is formed on the nitride thin film.

7. The method of claim 1, wherein the capping layer that is formed comprises a portion of the nitride thin film comprising silicon or boron as well as a layer comprising silicon or boron formed on the nitride layer.

8. The method of claim 1, wherein the nitride thin film is exposed to the silane or borane compound for about 45 seconds to about 180 seconds.

9. The method of claim 1, wherein the capping layer is less than about 3 nm thick.

10. The method of claim 9, wherein the capping layer is less than about 1 nm thick.

11. The method of claim 1, wherein the nitride thin film is directly over and contacting a metal carbide layer.

12. The method of claim 1, wherein the capping layer comprises more than about 20 % silicon, boron, and aluminum, combined, on an atomic basis after exposing.

13. The method of claim 1, wherein the silane or borane compound reduces oxidized portions of the nitride thin film.

14. The method of claim 1, wherein the nitride thin film is exposed to silane or disilane.

15. A method of treating a titanium nitride thin film on a substrate to increase oxidation resistance, the method comprising contacting the titanium nitride film with a silane compound or a borane compound, thereby forming a capping layer comprising silicon or boron.

16. The method of claim 15, wherein silicon or boron is incorporated into a portion of the titanium nitride thin film.

17. The method of claim 15, wherein the capping layer comprising silicon or boron is formed on the titanium nitride thin film.

18. The method of claim 15, wherein the titanium nitride thin film is contacted with the silane or borane compound for about 45 seconds to about 180 seconds.

19. The method of claim 15, wherein the capping layer is less than about 3 nm thick.

20. The method of claim 15, wherein the silane compound or borane compound is selected from the group consisting of monosilane, disilane, trisilane, organosilanes, borane, diborane, and organoboranes.

* * * * *